(12) United States Patent
Prodanov

(10) Patent No.: US 7,135,931 B2
(45) Date of Patent: Nov. 14, 2006

(54) NEGATIVE CONDUCTANCE POWER AMPLIFIER

(75) Inventor: Vladimir Prodanov, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 25 days.

(21) Appl. No.: 10/901,557

(22) Filed: Jul. 29, 2004

(65) Prior Publication Data

US 2006/0022755 A1    Feb. 2, 2006

(51) Int. Cl.
*H03F 3/191*   (2006.01)
(52) U.S. Cl. .................................. 330/302; 330/144
(58) Field of Classification Search ............... 330/295, 330/302, 144, 296
See application file for complete search history.

(56) References Cited

U.S. PATENT DOCUMENTS 6,639,464 B1 * 10/2003 Hellberg ................. 330/124 R
6,917,246 B1 *  7/2005 Thompson ................... 330/295

* cited by examiner

*Primary Examiner*—Robert Pascal
*Assistant Examiner*—Hieu Nguyen

(57) ABSTRACT

Power amplifiers are disclosed that demonstrate improved linearity and efficiency in applications requiring significant peak-to-average ratios (PAR). A power amplifier in accordance with the present invention comprises a first transistor in an input stage that converts DC power into AC power; and a second transistor in a negative conductance stage that has a current-voltage characteristic with at least two slopes. The at least two slopes of the current-voltage characteristic are separated by a break point that may be controlled. The power amplifier may also include a non-dissipative two-port device that has two AC ports. The non-dissipative two-port device has a Z matrix with two zero-valued diagonal elements and two complex valued off-diagonal elements having a same sign and only imaginary parts for an operating frequency. In one implementation, the diagonal entries of the Z matrix are small at twice the operating frequency.

25 Claims, 9 Drawing Sheets

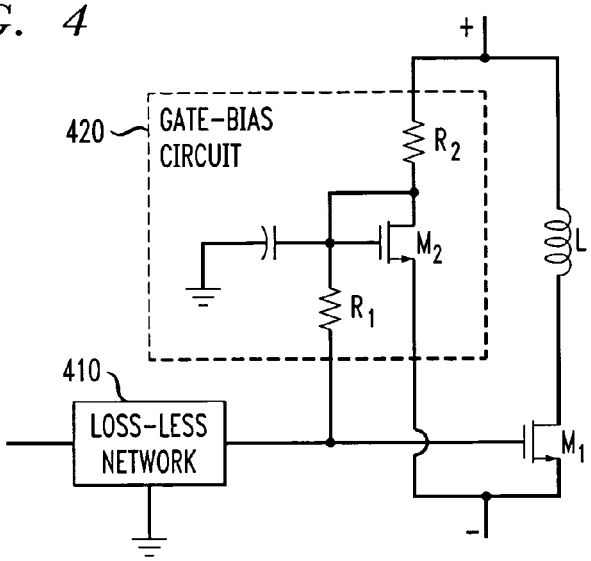

FIG. 4

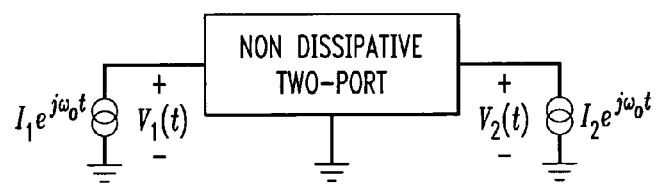

FIG. 5

$$\begin{bmatrix} V_1(t) \\ V_2(t) \end{bmatrix} = \begin{bmatrix} 0 & \pm jz \\ \pm jz & 0 \end{bmatrix} \begin{bmatrix} I_1 e^{j\omega_0 t} \\ I_2 e^{j\omega_0 t} \end{bmatrix}$$

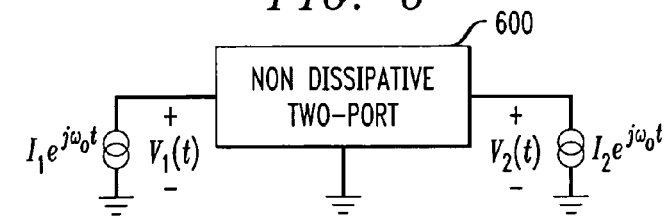

FIG. 6

$$\begin{bmatrix} V_1(t) \\ V_2(t) \end{bmatrix} = \begin{bmatrix} 0 & \pm jz_{12} \\ \pm jz_{21} & 0 \end{bmatrix} \begin{bmatrix} I_1 e^{j\omega_0 t} \\ I_2 e^{j\omega_0 t} \end{bmatrix} \quad \& \quad \begin{bmatrix} V_1(t) \\ V_2(t) \end{bmatrix} = \begin{bmatrix} 0 & 0 \\ 0 & 0 \end{bmatrix} \begin{bmatrix} I_1 e^{j2\omega_0 t} \\ I_2 e^{j2\omega_0 t} \end{bmatrix}$$

FIG. 7A

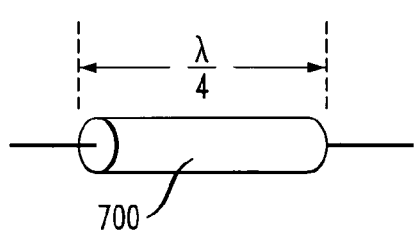

$$Z(\omega_0) = \begin{bmatrix} 0 & -jz_0 \\ -jz_0 & 0 \end{bmatrix}$$

FIG. 7B

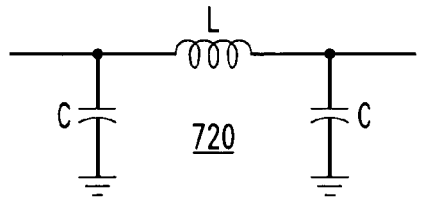

$$Z(\omega_0) = \begin{bmatrix} 0 & -jz_0 \\ -jz_0 & 0 \end{bmatrix}$$

$\omega_0 = 1/\sqrt{LC}$ $z_0 = \sqrt{L/C}$

FIG. 7C

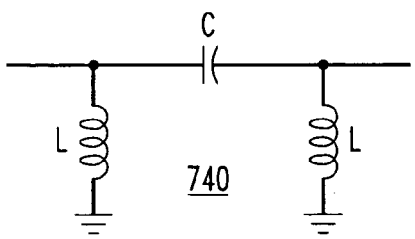

$$Z(\omega_0) = \begin{bmatrix} 0 & jz_0 \\ jz_0 & 0 \end{bmatrix}$$

$\omega_0 = 1/\sqrt{LC}$ $z_0 = \sqrt{L/C}$

FIG. 7D

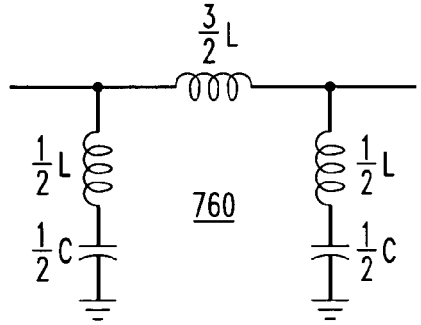

$$Z(\omega_0) = \begin{bmatrix} 0 & -jz_0 \\ -jz_0 & 0 \end{bmatrix}$$

$$Z(2\omega_0) = \begin{bmatrix} 0 & 0 \\ 0 & 0 \end{bmatrix}$$

$\omega_0 = 1/\sqrt{LC}$ $z_0 = \sqrt{L/C}$

NEGATIVE CONDUCTANCE POWER AMPLIFIER

FIELD OF THE INVENTION

The present invention relates generally to power amplifiers and, more particularly, to power amplifiers that demonstrate improved linearity and efficiency in applications requiring significant peak-to-average ratios (PAR).

BACKGROUND OF THE INVENTION

Many communications systems employ a power amplifier to increase the power level present in a signal to be transmitted over a channel. The power amplifier may drive, for example, an antenna. The efficiency of a power amplifier determines the portion of power provided to a power amplifier that is included in the output of the power amplifier. The greater the efficiency of a power amplifier, the more effectively energy is converted into signal energy rather than being dissipated as heat. Furthermore, the greater the efficiency, the less power a device may consume to provide a desired output power level. This is particularly important in battery operated devices where wasted power shortens the useful life of each charge on the battery.

Many modern communication protocols, such as Code Division Multiple Access (CDMA) and IEEE 802.11 a/g protocols, use signals with a varying envelope. The peak-to-average ratio could be as large as 10–12 dB. To maintain linearity, the amplifier operating level is "backed off" from its compression point by at least the amount of the PAR of the signal. As a result, the efficiency becomes a problem. The efficiency of a Class AB amplifier drops at a rate of approximately 0.5 dB for every 1 dB of back off. In general, for a 10 dB back off in Class AB amplifiers, the average power efficiency becomes less than twenty percent. For Class A amplifiers, the average power efficiency may be on the order of only 5 to 8 percent. Thus, only twenty percent (or less) of the consumed DC power is converted into Radio Frequency (RF) power (the remainder is converted into heat).

The PAR-linearity-efficiency problem is a long-standing one. Many solutions have been proposed or suggested. The only widely deployed power-efficient amplifier solution is referred to as the "Doherty Amplifier," suggested by William H. Doherty in 1935. For a detailed discussion of the Doherty amplifier, see, for example, Raab et al., "RF and Microwave Power Amplifier and Transmitter Technologies—Part 3," High Frequency Electronics, (September 2003). Generally, the Doherty amplifier obtains peak efficiency at a back-off of 0 dB and at least one other power level. The Doherty amplifier uses two separate active stages (amplifiers) that are coupled at their inputs and their outputs directly into a single load impedance. The Doherty amplifier achieves high efficiency by operating one Class AB amplifier into a load impedance two times larger than its optimum. This amplifier compresses and reaches peak efficiency at half of its maximum output power. A second Class C amplifier is made active only during the peaks of the input signal and is used to modulate the effective load impedance presented to the first amplifier. Maximum efficiency is achieved when the second amplifier puts out full power. Thus, the first amplifier is kept on the verge of saturation for a 6 dB range of output power and near peak efficiency is maintained.

The input coupling of the Doherty amplifier requires a specialized quadrature power splitter that is cumbersome to implement on silicon (i.e., with on-chip lumped components). Very few on-chip Doherty amplifiers have ever been reported. Furthermore, there is a dramatic change in the input impedance of the Class C stage when the amplifier transitions from a "non-amplification" mode into an amplification mode. Due to the input coupling, this change could disturb the operation of the main Class AB stage, resulting in an overall gain change and distortion.

A need therefore exists for power amplifiers that demonstrate improved linearity and efficiency in applications requiring significant peak-to-average ratios.

SUMMARY OF THE INVENTION

Generally, power amplifiers are provided that demonstrate improved linearity and efficiency in applications requiring significant peak-to-average ratios. A power amplifier in accordance with the present invention comprises a first transistor in an input stage that converts DC power into AC power; and a second transistor in a negative conductance stage that has a current-voltage characteristic with at least two slopes. The at least two slopes of the current-voltage characteristic are separated by a break point that may be controlled.

In addition, the power amplifier optionally includes a non-dissipative two-port device that has two AC ports. The non-dissipative two-port device has a Z matrix with two zero-valued diagonal elements and two complex valued off-diagonal elements having a same sign and only imaginary parts for an operating frequency. In one implementation, the diagonal entries of the Z matrix are small at twice the operating frequency.

A more complete understanding of the present invention, as well as further features and advantages of the present invention, will be obtained by reference to the following detailed description and drawings.

BRIEF DESCRIPTION OF THE DRAWINGS

FIG. 4 is an example of a suitable input stage of FIG. 3;

FIG. 5 is a schematic block diagram that illustrates the non-dissipative two-port device of FIG. 1 in further detail;

FIG. 6 is an example of a suitable non-dissipative two-port device of FIG. 5;

FIGS. 7A through 7D illustrates various exemplary implementations of the non-dissipative two-port device of FIG. 5;

DETAILED DESCRIPTION

Figure 1:
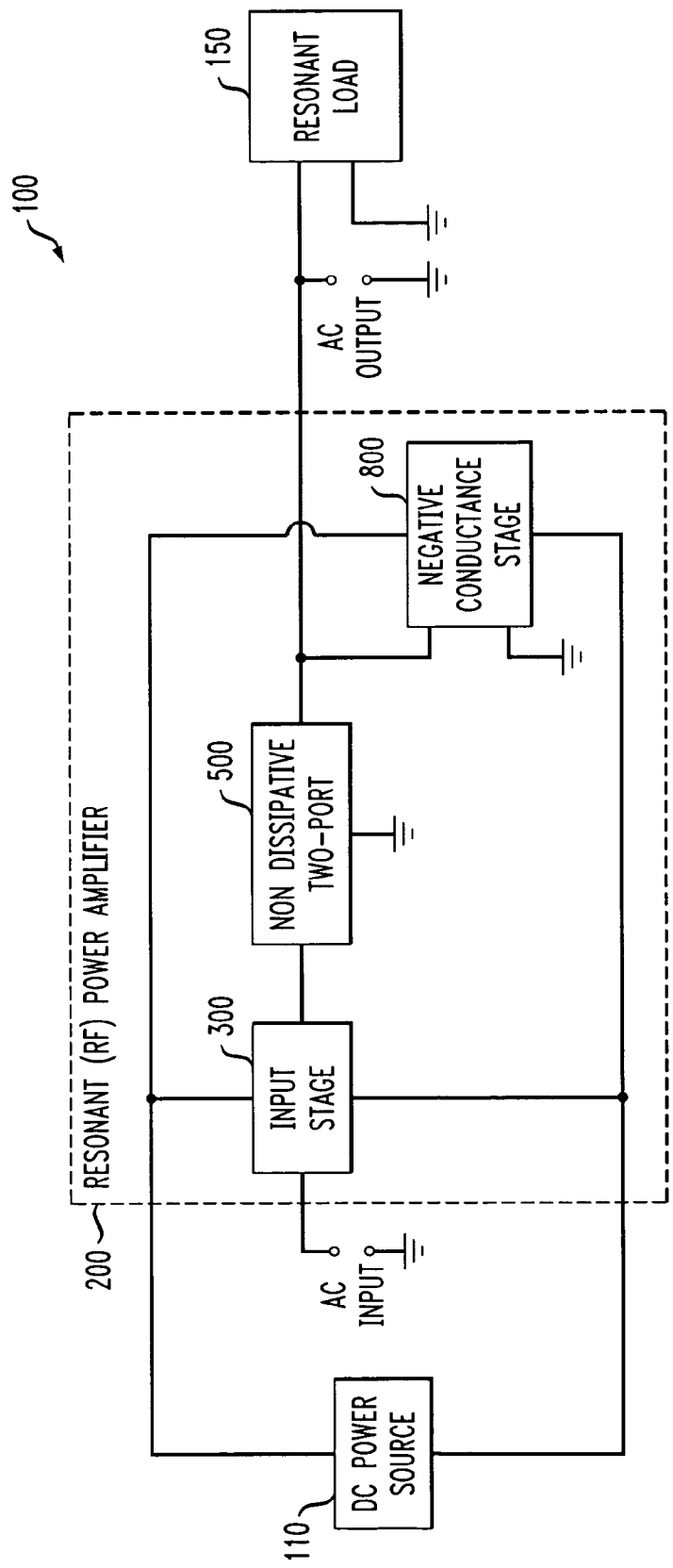
FIG. 1 illustrates a power amplifier incorporating features of the present invention.

The present invention provides power amplifiers with improved linearity and efficiency that are suitable for use in applications requiring significant peak-to-average ratios. FIG. 1 illustrates a power amplifier 100 incorporating features of the present invention. As shown in FIG. 1, the power amplifier 100 includes a DC power source 110, a resonant (RF) power amplifier 200, discussed further below in conjunction with FIG. 2, and a resonant load 150. As discussed further below in conjunction with FIGS. 2, 3, 5 and 8, the resonant (RF) power amplifier 200 includes an input stage 300, a non-dissipative two-port device 500 and a negative AC conductance stage 800.

The DC power source 110 provides DC power and has two DC terminals (positive and negative), with a sustained finite voltage difference between the DC terminals. In addition, the DC power source 110 exhibits nearly zero impedance between the two terminals for AC signals. The DC power source 110 may be embodied, for example, as a battery.

The resonant load 150 consumes AC power and has one AC port with essentially no phase difference between the I–V characteristic, and a single-slope (linear) $|I|$–$|V|$ characteristic. Furthermore, the AC port has an $|I|$–$|V|$ slope that is nearly equal to the large-voltage $|I|$–$|V|$ slope of the negative conductance slope. The resonant load 150 may be embodied, for example, as an antenna.

Figure 2:
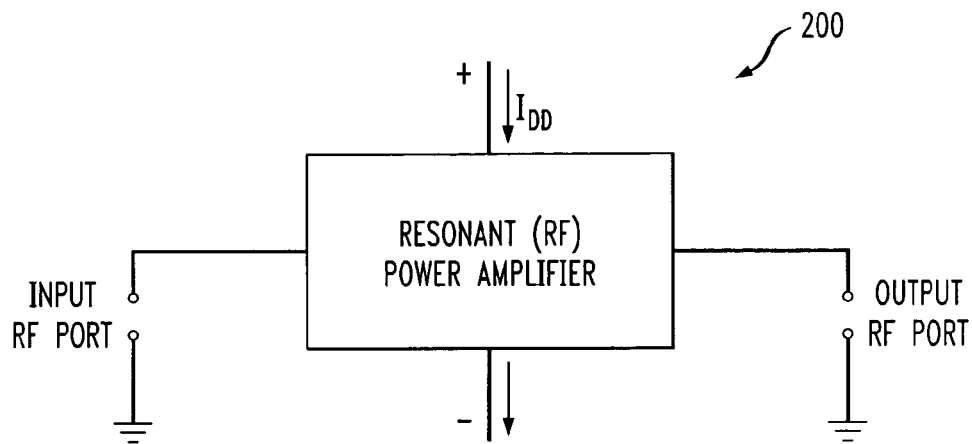
FIG. 2 is a schematic block diagram that illustrates the resonant (RF) power amplifier of FIG. 1 in further detail.

FIG. 2 is a schematic block diagram that illustrates the resonant (RF) power amplifier 200 of FIG. 1 in further detail. As indicated above, the resonant (RF) power amplifier 200 includes an input stage 300, a non-dissipative two-port device 500 and a negative AC conductance stage 800. As shown in FIG. 2, the resonant (RF) power amplifier 200 has two (positive and negative) DC terminals and two (input and output) AC ports. The positive and the negative DC terminals connect to the positive and negative terminals of the DC power source 110. Finite DC current is drawn from the supply 110 and conducted from the positive DC terminal, through the elements of the power amplifier 200, to the negative DC terminal. The power amplifier 200 consumes non-zero power ($I_{DD} \times V_{DD}$). The input port is connected to an AC (RF) source. An AC voltage with finite value develops across the input port and an AC current with finite value is drawn by the port. The phase difference between the port voltage and current is 90 degrees, so finite AC (RF) power is derived from the RF source.

The power amplifier 200 delivers a finite amount of AC power to the load 150. For a linear power amplifier 200, the load power is proportional to the input AC power. For any amplifier 200, the following holds: the delivered RF power is less than the sum of the consumed DC and input RF power. The difference is converted to heat and radiated out. Minimization of this loss is the primary objective in designing a power amplifier.

Figure 3:
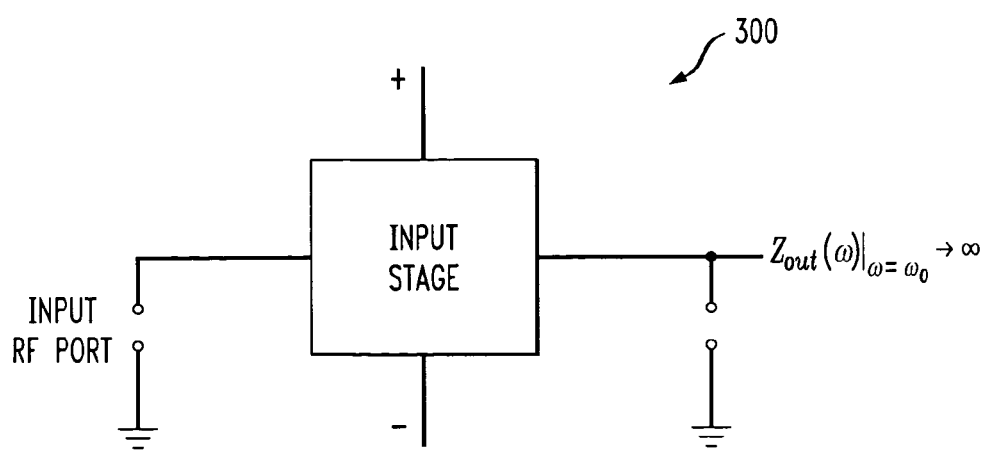
FIG. 3 is a schematic block diagram that illustrates the input stage of FIG. 1 in further detail.

FIG. 3 is a schematic block diagram that illustrates the input stage 300 of FIG. 1 in further detail. The input stage 300 converts the DC power into AC power, has two DC terminals and two AC ports (input and output). The output port has a high impedance. As discussed below in conjunction with FIG. 4, the input stage 300 uses at least one transistor operated in a linear Class-AB mode.

The input stage 300 has all of the characteristic features of a power amplifier, as discussed above in conjunction with FIG. 2. As shown in FIG. 3, the input stage 300 has two DC terminals and two AC ports. The DC terminals connect to the DC power source 110 while the input AC port connects to an AC (RF) source. The output port has the ability to deliver AC power into an AC load.

For the intended frequency of operation, the impedance seen at the output port of the input stage 300 is very high, i.e., the output port behaves as an AC current source. The value of the AC current sourced from the output port depends upon the value of the AC power dissipated in the input port. The active input stage 300 must contain at least one active device (e.g., a transistor).

FIG. 4 is an example of a suitable input stage 300 of FIG. 3. The exemplary input stage 300 shown in FIG. 4 consists of a transistor M1, an inductor L, a loss-less input network 410, and a gate-bias circuit 420. The transistor M1 is in a common-source configuration and therefore has a large output resistance. At high frequencies, however, the impedance is lowered by the drain-to-substrate capacitance. This drain-to-substrate capacitance, as well as other parasitic capacitances "hanging" from the drain node of the transistor M1, are resonated out by the inductor L. Thus, at the operating frequency, the output impedance of this circuit is maintained high. Inductor L also provides a DC path for the drain current of transistor M1.

The loss-less input network 410 is comprised of loss-less elements (such as inductors, capacitors, transmission lines). The loss-less input network 410 modifies the impedance seen at the gate (without dissipating any power) in such a way that the input impedance is mostly real and in practice often close to 50Ω (at RF most interfaces are 50Ω). This network may also provide "DC isolation" between the input and the gate of the transistor M1.

The gate-bias circuit 420 is comprised of a transistor M2, resistors R1 and R2 and a capacitor C that form a low-frequency circuit that is used to establish the operating gate bias of transistor M1.

It is noted that if an output matching (loss-less) network is added, standard Class-A or Class-AB (depending on the operating gate bias) power amplifier results.

FIG. 5 is a schematic block diagram that illustrates the non-dissipative two-port device 500 of FIG. 1 in further detail. The non-dissipative two-port device 500 consumes no power and has two AC ports. The non-dissipative two-port device 500 is a passive linear network built of reactive (non-power-consuming) elements, such as inductors, capacitors and transmission lines.

As shown in FIG. 5, at the operating frequency, the diagonal entries of its Z matrix 510 (the matrix that relates port voltages and currents) are zero-valued while the off-diagonal ones are complex-valued. The complex-valued entries have only imaginary parts. The sign of the two off-diagonal entries is the same (either "+" or "−"). The absolute value of the two off-diagonal entries is also the same.

Generally, the port voltages and currents are "cross-constrained." In other words, current I1 determines voltage V2 and current I2 determines voltage V1. If port one is driven by a sinusoidal current source with magnitude I1 then the voltage at the second port has magnitude z12×I1 and its phase differs from that of I1 by 90 degrees. A similar relation holds for I2 and V1.

FIG. 6 is an example of a suitable non-dissipative two-port device 500 of FIG. 5. As discussed above in conjunction with FIG. 5, at the operating frequency, the diagonal entries of its Z matrix (the matrix that relates port voltages and currents) are zero-valued while the off-diagonal ones are complex-valued; the complex-valued entries have only imaginary parts; the sign of the two off-diagonal entries is the same (either "+" or "−"); and the absolute value of the two off-diagonal entries are the same.

In addition to these requirements, the preferred implementation shown in FIG. 6 further requires that at twice the operating frequency, the diagonal entries of its Z matrix 620 are all small, ideally zero. Thus, if any of the current wave-forms injected into port one or port two contains a second harmonic (a condition that would occur in practice) this "parasitic signal" would not be able to induce any voltage.

FIGS. 7A through 7D illustrates various exemplary implementations of the non-dissipative two-port device 500 of FIG. 5. FIG. 7A, for example, is a well known passive micro-wave circuit 700 often referred to as a quarter-wave transformer or an impedance inverter. The circuits 720, 740, 760 of FIGS. 7B through 7C, respectively, are various implementations of impedance inverters as lumped-element circuits.

Figure 8A:
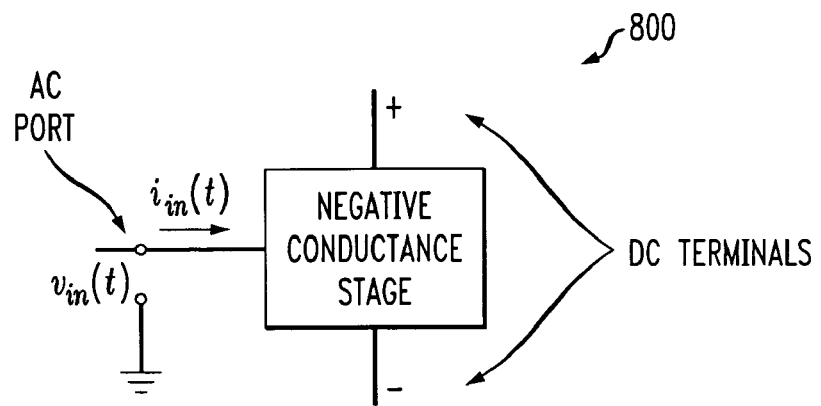
FIG. 8A is a schematic block diagram that illustrates the negative AC conductance stage of FIG. 1 in further detail.

FIG. 8A is a schematic block diagram that illustrates the negative AC conductance stage 800 of FIG. 1 in further detail. Generally, the negative AC conductance stage 800 converts DC power into AC power. As shown in FIG. 8A, the negative AC conductance stage 800 has two DC terminals and one AC port that accepts an AC voltage. The DC terminals connect to the DC power source 110. In a similar manner to a grounded conductance, the AC voltage causes flow of current. This current, however, has opposite polarity compared to the one flowing in a "regular" conductance. Thus, the AC port does not consume power but instead delivers AC power. Therefore, similar to a resonant power amplifier (200), the circuit 800 draws DC power and converts some of the DC power into an AC power (delivered to a load 150 if such is connected to the AC port). The difference between the drawn power and the delivered power is converted into heat and is dissipated.

As discussed below in conjunction with FIGS. 9A and 9B, the negative AC conductance stage 800 includes at least one transistor operated in a Class-C mode. It is noted that for AC signals, the input stage 300, the two-port device 500, and the negative conductance stage 800 appear connected in tandem.

Figure 8B:
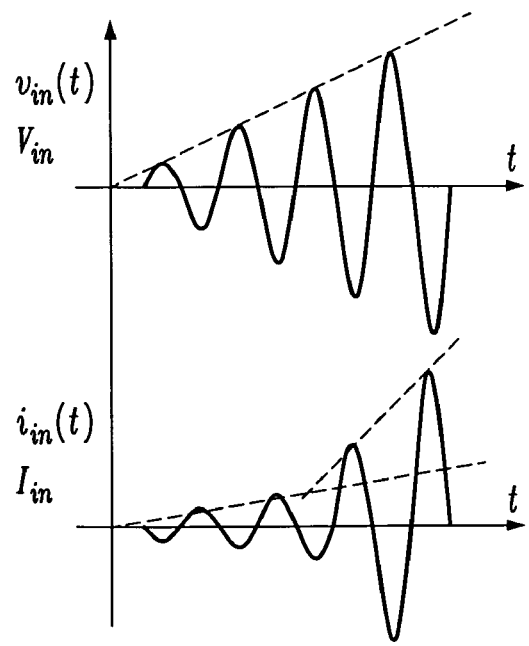
FIG. 8B illustrate the voltage and current characteristics of the negative AC conductance stage of FIG. 8A.

FIG. 8B illustrate the voltage and current characteristics of the negative AC conductance stage 800 of FIG. 8A. A negative AC conductance is linear if the magnitude of the produced AC current is a linear function of the magnitude of the applied AC voltage and the current-voltage phase difference is constant 180 degrees. A negative AC conductance is non-linear if the magnitude of the produced AC current is a non-linear function of the magnitude of the applied AC voltage. It is noted that the current-voltage phase difference must still be approximately 180 degrees in order to call the circuit a "conductance" circuit. According to one aspect of the invention, the negative AC conductance stage 800 demonstrates a negative AC conductance, such that is it non-linear with a pronounced two-slope (single break) characteristic. In one preferred implementation, the negative AC conductance has a slope of the low-voltage region that is approximately zero and the break point is adjustable by a control terminal.

Figure 9A:
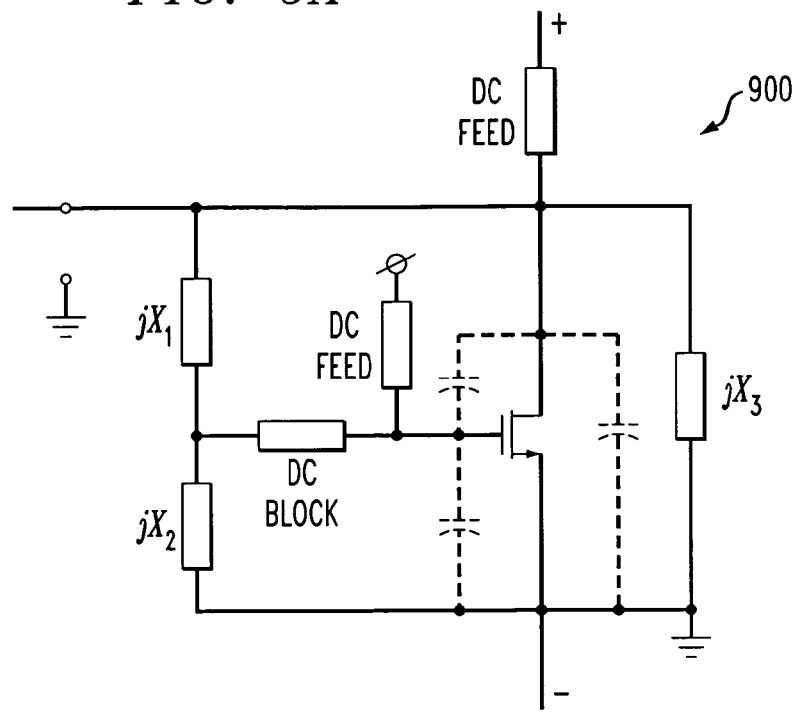
FIGS. 9A and 9B illustrate the general topology of a negative conductance stage with a transistor in a common-source configuration.
Figure 9B:
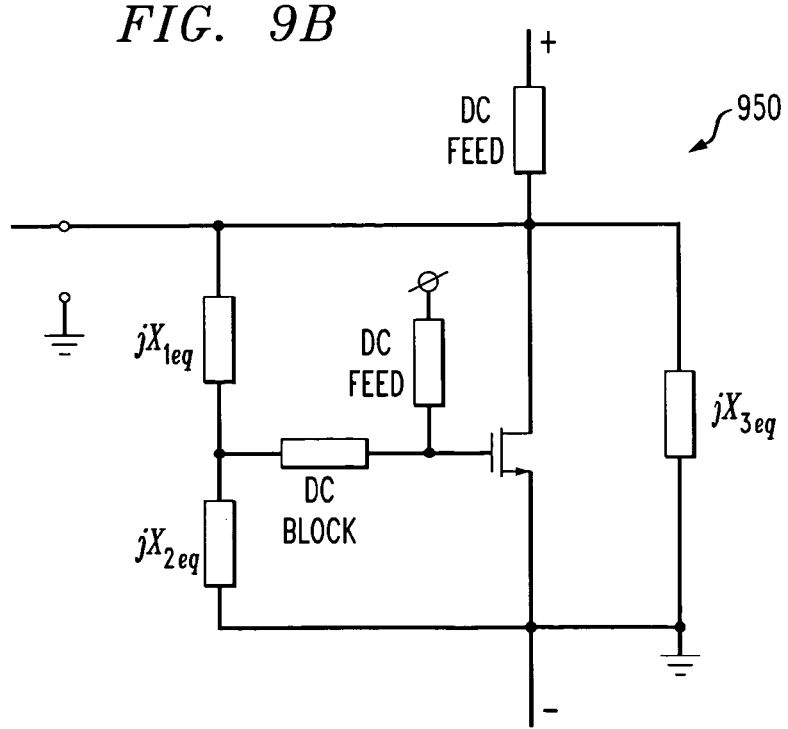

FIGS. 9A and 9B illustrate the general topology of a negative conductance stage 900, 950 with a transistor in a common-source configuration. Since most power transistors have the source/emitter tied to the substrate, the topologies shown in FIGS. 9A and 9B have the transistor in a common-source configuration. FIG. 9A illustrates the transistor with parasitic capacitances and FIG. 9B illustrates the electrical equivalent with the parasitic capacitances transferred across the DC blocks to provide impedance equivalents.

The drain and gate biasing is provided via the elements "DC feed1" and "DC feed2," respectively. The elements "DC feed1" and "DC feed2" ideally behave as a "DC short" and an "AC open" (in a similar manner to a large inductor). The element "DC block" has the opposite behavior, and behaves as a "DC open" and an "AC short" (in a similar manner to a large capacitor). The other three elements are non-dissipative lumped-elements (Ls and Cs). The sign of the reactances (X) determines the type: L has positive reactance, C has negative reactance. The over-all reactance seen between drain and gate (X1eq), gate and source (X2eq), and drain and source (X3eq) is determined by both the intentionally added (X1, X2 and X3) and the reactances contributed by the transistor "parasitic" capacitances (Cgd, Cgs and Cd_sub).

The reactive part of this circuit (intentional+parasitics) introduces inversion (180 degree phase shift) between the drain-source and gate-source AC voltages. This is achieved when the following requirements are met in FIG. 9B:

$$|X_{1eq}| > |X_{2eq}|$$

$$\text{sign}(X_{1eq}) \neq \text{sign}(X_{2eq})$$

$$\Downarrow$$

$$v_{gs}(t) = -\frac{|X_{1eq}|}{|X_{1eq}| - |X_{2eq}|} V_{in} e^{j\omega_o t}$$

and $$|X_{3eq}| = |X_{1eq}| - |X_{2eq}|$$

$$\text{sign}(X_{3eq}) = \text{sign}(X_{2eq})$$

If the magnitude of the equivalent reactance seen between the drain and gate is larger than that of the equivalent reactance seen between the gate and source and the two reactances have a different sign, then the voltage divider X1eq–X2eq of FIG. 9B operates as an inverter. In other words, the phase difference between the AC drain (input) voltage and the AC gate voltage is exactly 180 degrees. The reactance X3eq is chosen to form a parallel resonant circuit with the reactive divider. As a result, the only observed current at the input (the drain node) would be the drain current of the "ideal" transistor. Assuming that transistor fT is sufficiently high, the phase of the fundamental component of the drain current would equal that of the gate-source excitation (where fT indicates the frequency at which the current gain of the transistor drops to unity). Therefore, the fundamental component of the drain (input) current would be exactly 180 degrees out-of-phase with respect to the drain (input) voltage (thus realizing the required negative conductance).

It is noted that the exact configuration of the reactances X1, X2 and X3 has not been specified. As long as the basic relations between $X_{1eq}$, $X_{2eq}$ and $X_{3eq}$ are satisfied, anything goes. The reactances X1, X2 and X3 could be single-element (inductive or capacitive) components or multi-element components. This negative AC conductance stage 800 has the topology of a lumped-component oscillator (see, for example, the well known Colpitts, Hartley and Clapp common-source oscillators).

Figure 10A:
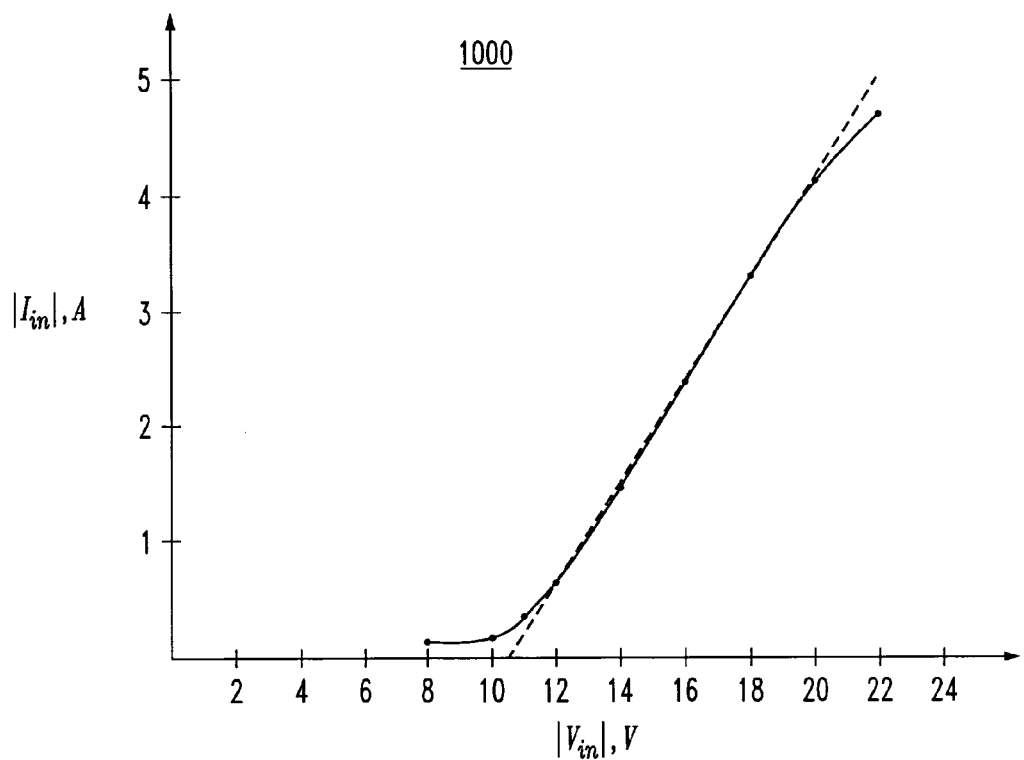
FIGS. 10A and 10B illustrate the simulated |I|–|V| and I–V phase dependence relationships, respectively, for an exemplary negative conductance stage in accordance with the present invention.
Figure 10B:
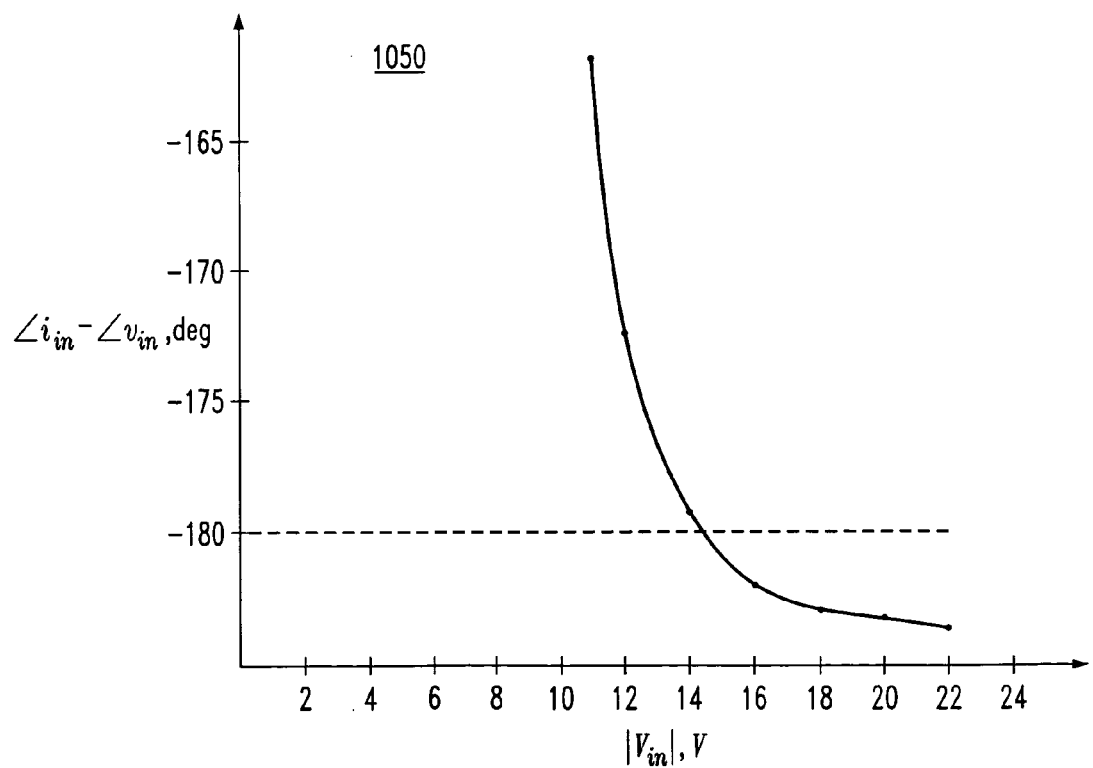

FIGS. 10A and 10B illustrate the simulated |I|–|V| and I–V phase dependence relationships, 1000, 1050, respectively, for an exemplary negative conductance stage operating at 900 MHz in accordance with the present invention. The exemplary negative conductance stage uses 45 W LDMOS device. Z1 is formed by a series of L1=1.5 nH and C1=pF, Z2=C2=pF and Z3=C3=pF. No DC block was needed and R=500 was used as a gate DC-feed.

For these values, the magnitude of the gate voltage is approximately one-third of that of the drain voltage. The produced results are for a gate bias of 0V. Since the threshold voltage of the device is approximately 3.7V, this constitutes a Class-C operation. The circuit is operated from a 28V power supply.

For this design, the |I|–|V| characteristic 1000 of FIG. 10A exhibits a slope of ~0.44 A/V for large signals and a "break point" of ~10.5V. For large signals (i.e., having a magnitude greater than 12V), the phase difference remains to within 3 degrees from the desired 180 degrees.

For small-signals, however, the characteristic 1000 deviates abruptly from 180 degrees. This is attributed to the device non-linear parasitic capacitances. As discussed below, this deviation is not very important.

Figure 11A:
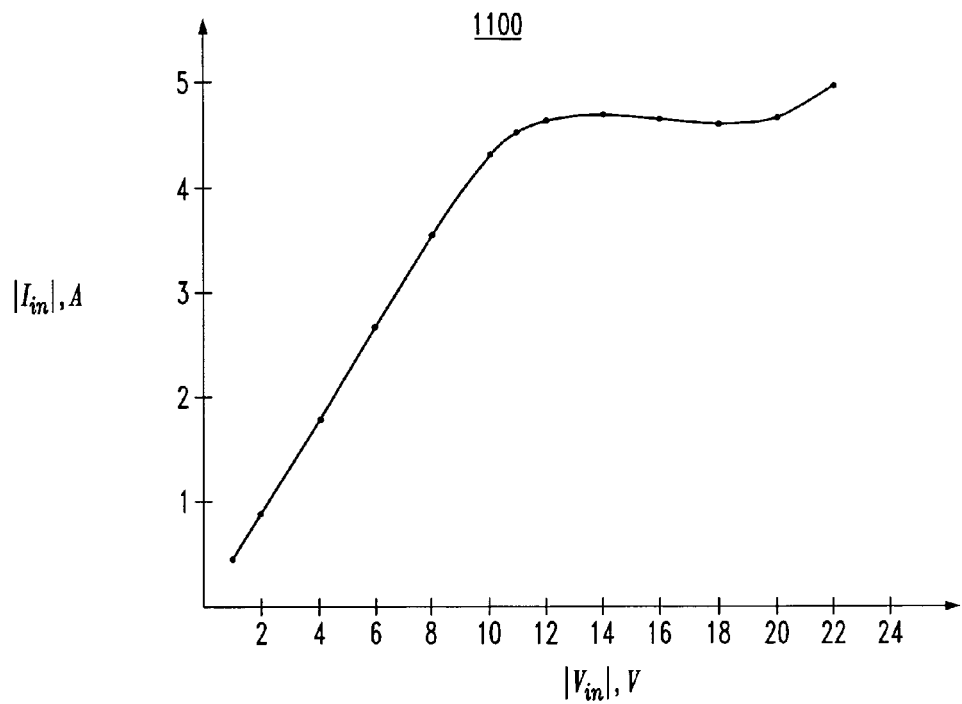
FIGS. 11A and 11B illustrate the simulated |I|–|V| and I–V phase dependence relationships, respectively, for an exemplary negative conductance stage in accordance with the present invention operating in parallel with a resonant linear load.
Figure 11B:
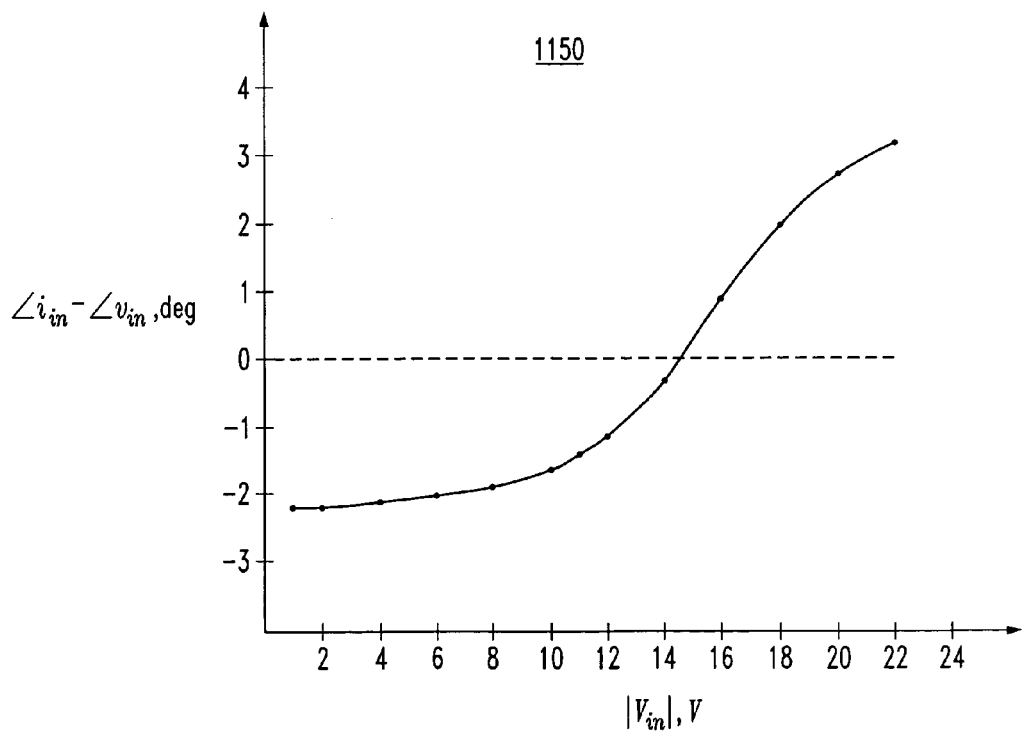

FIGS. 11A and 11B illustrate the simulated |I|–|V| and I–V phase dependence relationships 1100, 1150, respectively, for an exemplary negative conductance stage in accordance with the present invention operating in parallel with a resonant linear load. The value of the load is chosen to be approximately 0.44A/V (or 2.27 ohms). For voltage excitations with small magnitudes (<10V), the negative conductance stage LDMOS transistor is in a cut-off mode and the input current is that drawn by the passive 2.27 ohms load.

As the signal exceeds the break point of approximately 10.5V, the negative conductance stage starts contributing current. This current compensates for the increase in the load current. Thus, an insignificant increase in the input current is observed for input signals with a magnitude greater 12V. The magnitude of the input current remains nearly constant at 4.7A even though the input voltage magnitude increases by approximately a factor of two (from ~12 to ~24V).

It is noted that the parallel negative conductance stage-load combination remains "resistive" (small phase deviations away from 0 degrees) even though the negative conductance stage phase was not very constant. This could be explained with the fact that the phase variation is large only when the negative conductance stage current magnitude is small (much smaller than the magnitude of the current drawn by the load).

Figure 12:
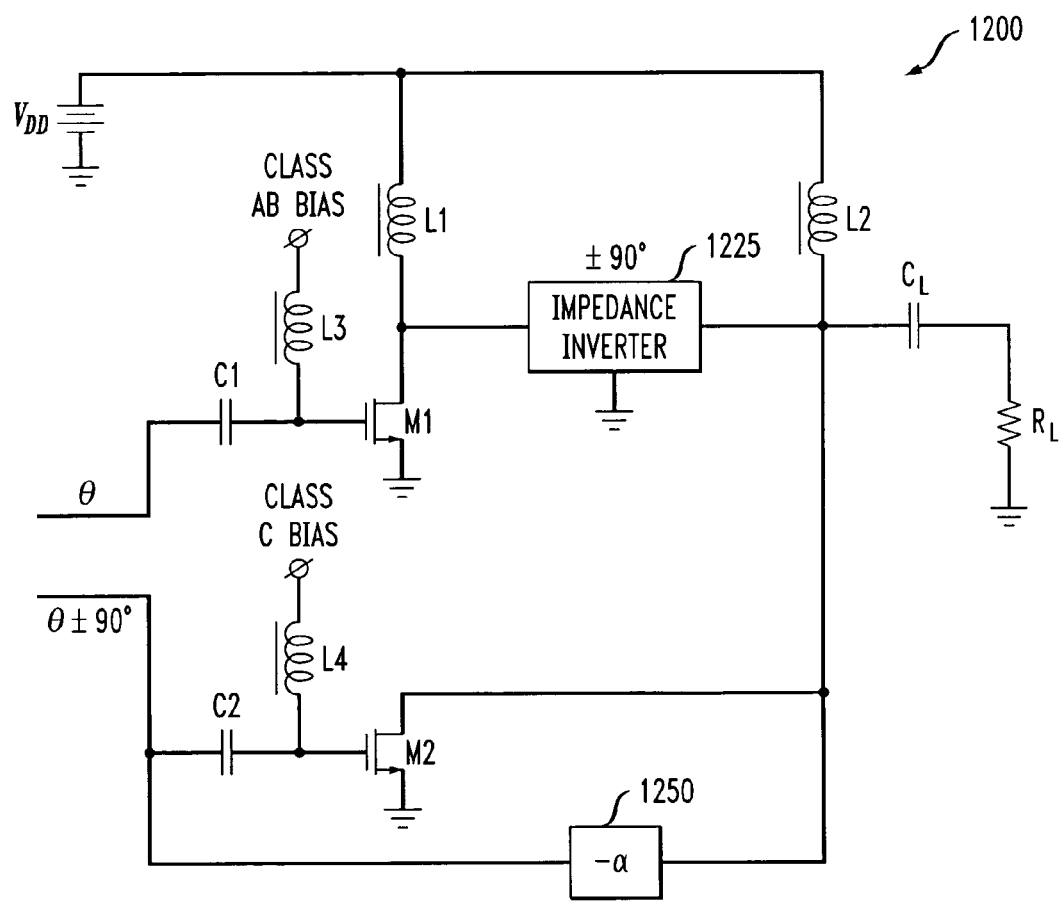
FIG. 12 is a schematic block diagram of a negative conductance power amplifier that incorporates features of the present invention, as derived from a conventional Doherty amplifier.

FIG. 12 is a schematic block diagram of a negative conductance power amplifier 1200 that incorporates features of the present invention, as derived from a conventional Doherty amplifier. As shown in FIG. 12, the negative conductance power amplifier 1200 does not require coupling by a quadrature power splitter at the input, as required in a Doherty amplifier. The input stage 300 is embodied using the transistor M1. Using the notation of FIGS. 9A and 9B, the negative conductance power amplifier 1200 includes a DC Feed 1 (L1), a DC Feed 2 (L3), a DC Block (C1), a DC bias for the drain of transistor M1 and a Class AB bias derived from an appropriate bias circuit (not shown).

In addition, the non-dissipative two-port device 500 is embodied as the impedance inverter 1225, which may be, for example, a quarter-wave transformer.

The negative AC conductance stage 800 is embodied using the transistor M2 (in a similar manner to the peaking amplifier of the Doherty amplifier). The transistor M2 has an inductor L2 that provides a DC bias for the drain, an inductor L4 that provides a Class C bias, and a capacitor C2 that serves as a DC block.

As shown in FIG. 12, the phase of the gate voltage of transistor M1 is θ and the drain current of M1 is θ+180 degrees (Common-Source is inverting topology). Thus, the phase of the voltage seen across the load, $R_L$, is θ+180 degrees±90 degrees (due to impedance inverter 1225). The gate voltage of M2, as required for a conventional Doherty amplifier, is θ±90 degrees.

The implementation of FIG. 12 recognizes that the desired gate drive voltage for transistor M2 is exactly 180 degrees out-of-phase with respect to the output voltage across $R_L$. The drive for the transistor M2 can thus be obtained from the output via a reactive (non-power consuming) inverter 1250. The peaking stage of a conventional Doherty amplifier thus becomes a negative conductance one-port. The load, $R_L$, is shown as a resistor, and the capacitor, $C_L$, acts as a DC block.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

It is to be understood that the embodiments and variations shown and described herein are merely illustrative of the principles of this invention and that various modifications may be implemented by those skilled in the art without departing from the scope and spirit of the invention.

I claim:

1. A power amplifier, comprising:
   a first transistor in an input stage for converting DC power into AC power; and
   a second transistor in a negative conductance stage having only one AC port and a current-voltage characteristic with at least two slopes.

2. The power amplifier of claim 1, wherein said input stage has two DC terminals and two AC ports.

3. The power amplifier of claim 1, wherein said input stage has an output port having a high impedance.

4. The power amplifier of claim 1, further comprising a non-dissipative two-port device having two AC ports.

5. The power amplifier of claim 4, wherein said non-dissipative two-port device has a Z matrix with two zero-valued diagonal elements and two complex valued off-diagonal elements having a same sign and only imaginary parts for an operating frequency.

6. The power amplifier of claim 5, wherein diagonal entries of said Z matrix are small at twice said operating frequency.

7. The power amplifier of claim 4, wherein said non-dissipative two-port device is embodied as a plurality of inductors, capacitors, transmission lines, or a combination thereof.

8. The power amplifier of claim 1, wherein said negative conductance stage has two DC terminals and one AC port.

9. The power amplifier of claim 1, wherein said at least two slopes of said current-voltage characteristic of said negative conductance stage are separated by a break point.

10. The power amplifier of claim 9, wherein said break point is controllable.

11. The power amplifier of claim 1, wherein a first of said at least two slopes is approximately zero.

12. The power amplifier of claim 1, wherein said current-voltage characteristic of said negative conductance stage has a phase difference of approximately 180 degrees.

13. The power amplifier of claim 1, wherein said first transistor is operated in a Class AB mode.

14. The power amplifier of claim 1, wherein said second transistor operated in a Class C mode.

15. An integrated circuit, comprising:
a power amplifier having a first and second transistor, wherein:
said first transistor is in an input stage for converting DC power into AC power; and
said second transistor is in a negative conductance stage having only one AC port and a current-voltage characteristic with at least two slopes.

16. The integrated circuit of claim 15, wherein said input stage has an output port having a high impedance.

17. The integrated circuit of claim 15, further comprising a non-dissipative two-port device having two AC ports.

18. The integrated circuit of claim 17, wherein said non-dissipative two-port device has a Z matrix with two zero-valued diagonal elements and two complex valued off-diagonal elements having a same sign and only imaginary parts for an operating frequency.

19. The integrated circuit of claim 18, wherein diagonal entries of said Z matrix are small at twice said operating frequency.

20. The integrated circuit of claim 15, wherein said at least two slopes of said current-voltage characteristic of said negative conductance stage are separated by a break point.

21. The integrated circuit of claim 15, wherein a first of said at least two slopes is approximately zero.

22. The integrated circuit of claim 15, wherein said current-voltage characteristic of said negative conductance stage has a phase difference of approximately 180 degrees.

23. The integrated circuit of claim 15, wherein said first transistor is operated in a Class AB mode.

24. The integrated circuit of claim 15, wherein said second transistor operated in a Class C mode.

25. A method for amplifying an input signal, comprising:
applying said input signal to a first transistor in an input stage that converts DC power into AC power; and
applying an output of said first transistor to a second transistor in a negative conductance stage having only one AC port and a current-voltage characteristic with at least two slopes.

* * * * *